United States Patent
Ono et al.

(10) Patent No.: US 9,312,436 B2
(45) Date of Patent: Apr. 12, 2016

(54) NITRIDE SEMICONDUCTOR DEVICE, NITRIDE SEMICONDUCTOR WAFER, AND METHOD FOR MANUFACTURING NITRIDE SEMICONDUCTOR LAYER

(71) Applicant: Kabushiki Kaisha Toshiba, Tokyo (JP)

(72) Inventors: Hiroshi Ono, Kanagawa-ken (JP); Tomonari Shioda, Kanagawa-ken (JP); Naoharu Sugiyama, Kanagawa-ken (JP); Toshiyuki Oka, Kanagawa-ken (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 64 days.

(21) Appl. No.: 13/839,788

(22) Filed: Mar. 15, 2013

(65) Prior Publication Data

US 2013/0228745 A1 Sep. 5, 2013

Related U.S. Application Data

(63) Continuation-in-part of application No. 13/219,011, filed on Aug. 26, 2011, now abandoned.

(30) Foreign Application Priority Data

May 16, 2011 (JP) .................................. 2011-109191
Feb. 14, 2012 (JP) .................................. 2012-029992

(51) Int. Cl.
*H01L 33/12* (2010.01)
*H01L 33/32* (2010.01)
(Continued)

(52) U.S. Cl.
CPC ............ *H01L 33/12* (2013.01); *H01L 21/0254* (2013.01); *H01L 21/02381* (2013.01); *H01L 21/02458* (2013.01); *H01L 21/02488* (2013.01); *H01L 21/02491* (2013.01); *H01L 21/02502* (2013.01); *H01L 21/02513* (2013.01); *H01L 33/32* (2013.01); *H01L 33/007* (2013.01)

(58) Field of Classification Search
CPC . H01L 33/06; H01L 33/0075; H01L 21/0254; H01L 29/2003
See application file for complete search history.

(56) References Cited

U.S. PATENT DOCUMENTS 7,244,957 B2 7/2007 Nakajo et al.
7,569,911 B2 8/2009 Shiga et al.
(Continued)

FOREIGN PATENT DOCUMENTS

JP 8-264829 10/1996
JP 9-92882 4/1997
(Continued)

OTHER PUBLICATIONS

Japanese Office Action issued Nov. 17, 2014, in Japan Patent Application No. 2013-24681 (with English translation).
(Continued)

*Primary Examiner* — Marc Armand
*Assistant Examiner* — Quinton Brasfield
(74) *Attorney, Agent, or Firm* — Oblon, McClelland, Maier & Neustadt, L.L.P (57) ABSTRACT

According to one embodiment, a nitride semiconductor device includes a first layer and a functional layer. The first layer is formed on an amorphous layer, includes aluminum nitride, and has a compressive strain or a tensile strain. The functional layer is formed on the first layer and includes a nitride semiconductor.

15 Claims, 9 Drawing Sheets

(51) Int. Cl.
   *H01L 21/02*      (2006.01)
   *H01L 33/00*      (2010.01)

(56) References Cited

U.S. PATENT DOCUMENTS

| | | | |
|---|---|---|---|
| 7,999,249 B2* | 8/2011 | Moteki | H01L 33/20 257/12 |
| 2004/0094756 A1* | 5/2004 | Moon | H01L 21/02381 257/13 |
| 2005/0106849 A1* | 5/2005 | Gwo | H01L 21/02381 438/602 |
| 2006/0169989 A1* | 8/2006 | Bhattacharya | H01L 51/0021 257/79 |
| 2006/0249847 A1* | 11/2006 | Eriksen et al. | 257/751 |
| 2007/0194344 A1* | 8/2007 | Kim | H01L 21/02378 257/103 |
| 2009/0032799 A1 | 2/2009 | Pan | |
| 2009/0214859 A1* | 8/2009 | Finkikoglu | B32B 27/00 428/339 |
| 2009/0224660 A1* | 9/2009 | Nakanishi et al. | 313/504 |
| 2010/0032644 A1* | 2/2010 | Akita | H01L 33/32 257/13 |
| 2011/0248241 A1* | 10/2011 | Shimizu et al. | 257/15 |

FOREIGN PATENT DOCUMENTS

| | | |
|---|---|---|
| JP | 9-162125 | 6/1997 |
| JP | 2002-284600 | 10/2002 |
| JP | 2003-171200 | 6/2003 |
| JP | 2003-523081 | 7/2003 |
| JP | 3456404 | 8/2003 |
| JP | 2004-515074 | 5/2004 |
| JP | 2004/165502 | 6/2004 |
| JP | 2007-95845 | 4/2007 |
| JP | 3960815 | 5/2007 |
| JP | 2009-527913 | 7/2009 |
| JP | 4724256 B2 | 7/2011 |
| WO | WO 02/45140 A2 | 6/2002 |
| WO | WO 2006/126330 A1 | 11/2006 |

OTHER PUBLICATIONS

Notification of Reason(s) for Refusal issued Jun. 10, 2013 in Japanese Patent Application No. 2012-029992 (with English translation).
Office Action issued Nov. 21, 2011, in Japanese Patent Application No. 2011-109191 with English translation.
Japanese Office Action issued Feb. 28, 2012 in patent application No. 2011-109191 with English translation.
Japanese Office Action issued Sep. 17, 2013, in Japan Patent Application No. 2012-029992 (with English translation).

* cited by examiner

NITRIDE SEMICONDUCTOR DEVICE, NITRIDE SEMICONDUCTOR WAFER, AND METHOD FOR MANUFACTURING NITRIDE SEMICONDUCTOR LAYER

CROSS-REFERENCE TO RELATED APPLICATIONS

This is a Continuation-in-Part application of application Ser. No. 13/219,011, filed on Aug. 26, 2011; the entire contents of which are incorporated herein by reference.

This application is based upon and claims the benefit of priority from Japanese Patent Application No. 2011-109191, filed on May 16, 2011, and from Japanese Patent Application No. 2012-029992, filed on Feb. 14, 2012; the entire contents of which are incorporated herein by reference.

FIELD

Embodiments described herein relate generally to a nitride semiconductor device, a nitride semiconductor wafer, and a method for manufacturing a nitride semiconductor layer.

BACKGROUND

Various kinds of nitride semiconductor devices using a nitride semiconductor, such as gallium nitride, have been developed. Examples thereof include semiconductor light emitting devices, such as an ultraviolet, blue, or green light emitting diode (LED), and a purple-blue or blue laser diode (LD).

A GaN layer of the nitride semiconductor device is usually formed on a sapphire substrate or the like. However, due to a reduction in cost and an increase in diameter of a wafer, it is desirable to establish a technique for growing the GaN layer on a substrate other than the sapphire substrate.

DETAILED DESCRIPTION

In general, according to one embodiment, a nitride semiconductor device includes a foundation layer and a functional layer. The foundation layer is formed on an amorphous layer and includes aluminum nitride. The functional layer is formed on the foundation layer and includes a nitride semiconductor.

According to another embodiment, a nitride semiconductor wafer includes a substrate, an amorphous layer, a foundation layer, and a functional layer. The amorphous layer is provided on the substrate. The foundation layer is provided on the amorphous layer and includes aluminum nitride. The functional layer is formed on the foundation layer and includes a nitride semiconductor.

According to another embodiment, a method for manufacturing a nitride semiconductor layer is disclosed. The method can form an amorphous layer on a substrate. The method can form a foundation layer including aluminum nitride on the amorphous layer. In addition, the method can form a functional layer including a nitride semiconductor on the foundation layer.

According to one embodiment, a nitride semiconductor device includes a first layer and a functional layer. The first layer is formed on an amorphous layer, includes aluminum nitride, and has a compressive strain or a tensile strain. The functional layer is formed on the first layer and includes a nitride semiconductor.

Exemplary embodiments of the invention will now be described in detail with reference to the drawings.

The drawings are schematic or conceptual; and the relationships between the thickness and width of portions, the proportions of sizes among portions, etc., are not necessarily the same as the actual values thereof. Further, the dimensions and proportions may be illustrated differently among the drawings, even for identical portions.

In the specification and the drawings of the application, components similar to those described in regard to a drawing thereinabove are marked with like reference numerals, and a detailed description is omitted as appropriate.

First Embodiment

The embodiment relates to nitride semiconductor devices. A nitride semiconductor device according to the embodiment includes semiconductor devices, such as a semiconductor light emitting device, a semiconductor light receiving device, and an electron device. The examples of the semiconductor light emitting device include a light emitting diode (LED), a laser diode (LD), and the like. The semiconductor light receiving device includes a photodiode (PD) and the like. The examples of the electron device include a high electron mobility transistor (HEMT), a hetero junction bipolar transistor (HBT), a field effect transistor (FET), a schottky barrier diode (SBD), and the like.

Figure 1:
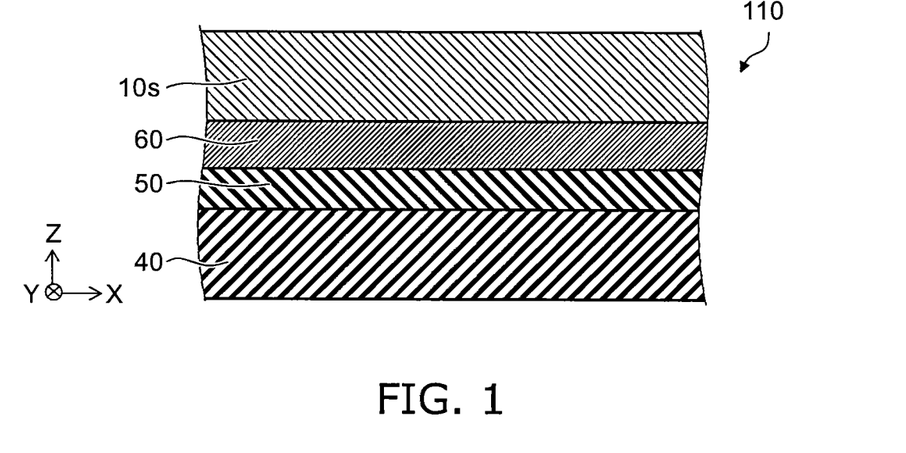
FIG. 1 is a schematic cross-sectional view showing a nitride semiconductor device according to a first embodiment.

FIG. 1 is a schematic cross-sectional view illustrating the configuration of a nitride semiconductor device according to a first embodiment.

As shown in FIG. 1, a nitride semiconductor device 110 according to the embodiment includes a foundation layer 60 and a functional layer 10s. The foundation layer 60 is formed on an amorphous layer 50. The foundation layer 60 includes aluminum nitride (AlN). The amorphous layer 50 is provided on a substrate 40, for example. The functional layer 10s includes a nitride semiconductor.

The direction from the foundation layer 60 toward the functional layer 10s is defined as a Z-axis direction. One axis perpendicular to the Z-axis is defined as an X-axis. The direction perpendicular to the Z-axis and the X-axis is defined as a Y-axis.

Hereinafter, a case is described where the nitride semiconductor device 110 is a light emitting device.

Figure 2:
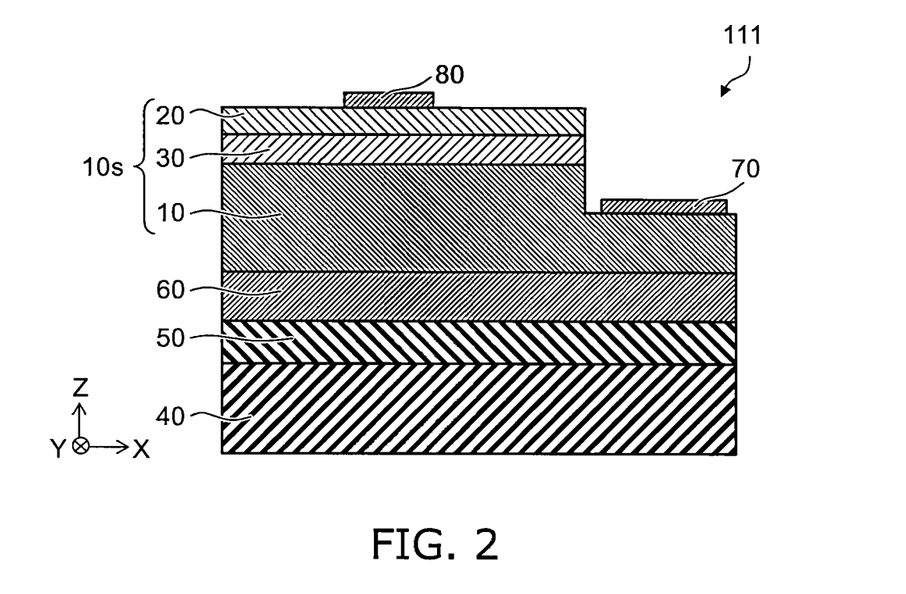
FIG. 2 is a schematic cross-sectional view showing the nitride semiconductor device according to the first embodiment.

FIG. 2 is a schematic cross-sectional view illustrating the configuration of the nitride semiconductor device according to the first embodiment.

As shown in FIG. 2, in a nitride semiconductor device 111 which is one example according to the embodiment, the functional layer 10s includes a first semiconductor layer 10, a light emitting part 30, and a second semiconductor layer 20. The first semiconductor layer 10 is formed on the foundation layer 60. The first semiconductor layer 10 includes a nitride semiconductor and is of a first conductivity type. The light emitting part 30 is provided on the first semiconductor layer 10. The second semiconductor layer 20 is provided on the light emitting part 30. The second semiconductor layer 20 includes a nitride semiconductor and is of a second conductivity type. The second conductivity type differs from the first conductivity type.

For example, the first conductivity type is an n-type and the second conductivity type is a p-type. Moreover, the first conductivity type may be a p-type and the second conductivity type may be an n-type. Hereinafter, the description is made on the case where the first conductivity type is an n-type and the second conductivity type is a p-type.

The nitride semiconductor device 110 can further include a first electrode 70 and a second electrode 80. The first electrode 70 is electrically connected to the first semiconductor layer 10. The second electrode 80 is electrically connected to the second semiconductor layer 20.

In this example, in the major surface on a side of the second semiconductor layer 20 of the functional layer 10s, a part of the first semiconductor layer 10 and the second semiconductor layer 20 are exposed. On the major surface side, the first electrode 70 and the second electrode 80 are connected to the first semiconductor layer 10 and the second semiconductor layer 20, respectively.

By applying a voltage between the first electrode 70 and the second electrode 80, a current is supplied to the light emitting part 30 via the first semiconductor layer 10 and the second semiconductor layer 20 and light is emitted from the light emitting part 30.

Figure 3:
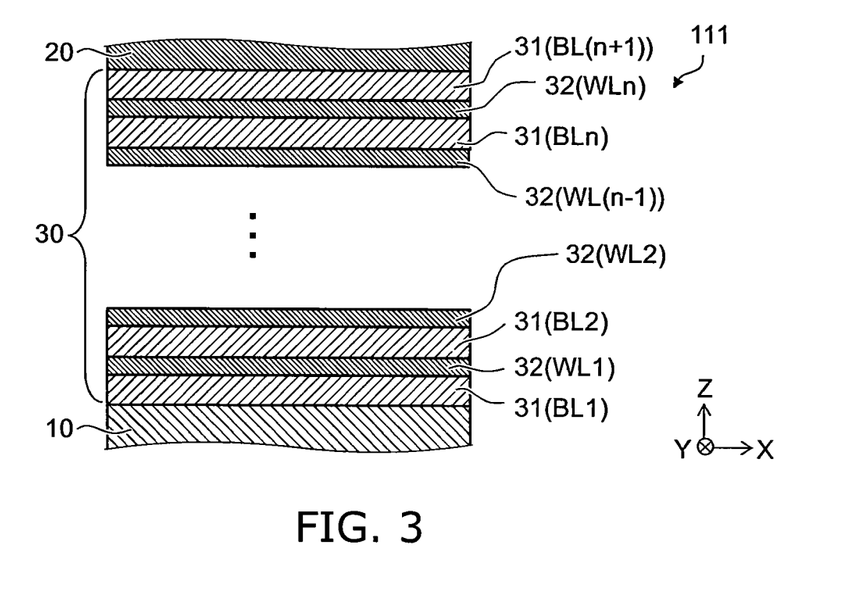
FIG. 3 is a schematic cross-sectional view showing a part of the nitride semiconductor device according to the first embodiment.

FIG. 3 is a schematic cross-sectional view illustrating the configuration of a part of the nitride semiconductor device according to the first embodiment.

As shown in FIG. 3, the light emitting part 30 includes a plurality of barrier layers 31 and the well layers 32 provided between the barrier layers 31. For example, the barrier layers 31 and the well layers 32 are alternately stacked along the Z-axis.

In the specification, a "stacked layer" includes the case where layers are stacked while another layer is inserted therebetween other than the case where layers are stacked in contact with each other. Moreover, "being provided on" includes the case of being provided while another layer is inserted therebetween other than the case of being provided directly in contact therewith.

The well layer 32 includes $In_{x1}Ga_{1-x1}N$ (0<x1<1), for example. The barrier layer 31 includes GaN, for example. That is, the barrier layer 31 contains In and the well layer 32 does not substantially contain In, for example. The bandgap energy in the barrier layer 31 is larger than the bandgap energy in the well layer 32.

The light emitting part 30 may have a single quantum well (SQW) structure. In this case, the light emitting part 30 includes two barrier layers 31 and the well layer 32 provided between the barrier layers 31. Alternatively, the light emitting part 30 may have a multi quantum well (MQW) structure. In this case, the light emitting part 30 includes three or more barrier layers 31 and the well layer 32 provided between the respective barrier layers 31.

That is, the light emitting part 30 includes (n+1) barrier layers 31 and n well layers 32 ("n" is an integer not less than 2). The (i+1)th barrier layer BL(i+1) is arranged between the i-th barrier layer BLi and the second semiconductor layer 20 ("i" is an integer not less than 1 and not more than (n−1)). The (i+1)th well layer WL(i+1) is arranged between the i-th well layer WLi and the second semiconductor layer 20. The first barrier layer BL1 is provided between the first semiconductor layer 10 and the first well layer WL1. The n-th well layer WLn is provided between the n-th barrier layer BLn and the (n+1)th barrier layer BL(n+1). The (n+1)th barrier layer BL(n+1) is provided between the n-th well layer WLn and the second semiconductor layer 20.

The peak wavelength of light (luminescent light) emitted from the light emitting part 30 is not less than 400 nanometers (nm) and not more than 650 nm, for example. However, in the embodiment, the peak wavelength is arbitrary.

For the first semiconductor layer 10, a GaN layer containing an n-type impurity is used, for example. For the n-type impurity, at least one of Si, Ge, Te and Sn can be used. The first semiconductor layer 10 includes an n-side contact layer, for example.

For the second semiconductor layer 20, a GaN layer containing a p-type impurity is used, for example. For the p-type impurity, at least one of Mg, Zn, and C can be used. The second semiconductor layer 20 includes a p-side contact layer, for example.

As illustrated in FIG. 1 and FIG. 2, the nitride semiconductor devices 110 and 111 according to the embodiment can further include the substrate 40. The substrate 40 is provided as required and may be omitted.

For the substrate 40, Si is used, for example. The embodiment is not limited thereto, and for example, for the substrate 40, one of Si, $SiO_2$, quartz, sapphire, GaN, SiC and GaAs is used. Then, the plane direction of the substrate 40 is arbitrary. In the following, an example using a Si substrate as the substrate 40 is described.

On the substrate 40, the amorphous layer 50 is formed. On the amorphous layer 50, the foundation layer 60 of AlN is formed. Then, preferably, the foundation layer 60 is orientated substantially in the Z-axis direction (the direction perpendicular to the layer face of the foundation layer 60).

On the foundation layer 60, the first semiconductor layer 10 is formed. On the first semiconductor layer 10, the light emitting part 30 is formed. On the light emitting part 30, the second semiconductor layer 20 is formed. For example, the substrate 40 may be removed after forming the functional layer 10s (the first semiconductor layer 10, the light emitting part 30, and the second semiconductor layer 20).

For the amorphous layer 50, $SiO_2$ is used, for example. The embodiment is not limited thereto, and for the amorphous layer 50, one of $SiO_2$ and the amorphous Si is used, for example. Moreover, for the amorphous layer 50, an amorphous metal film (TaAl or the like) may be used. $SiO_2$ or amorphous Si is used as the amorphous layer 50, and thus the thermal stability of the amorphous layer 50 increases. Therefore, the process resistance during the formation of the functional layer 10s formed thereon will improve, which is more preferable.

In this manner, in the nitride semiconductor devices 110 and 111 according to the embodiment, an AlN layer (foundation layer 60) is provided on the amorphous layer 50. Therefore, on the substrate 40 having a crystallinity different from the functional layer 10s (e.g., GaN layer), the functional layer 10s with a high crystal quality can be formed.

Hereinafter, the experimental result forming the basis for building the configuration according to the embodiment is described.

The inventors formed various amorphous layers on a Si (100) substrate, and formed an AlN layer on the amorphous layers.

A TaAl film, $SiO_2$ film, or a-Si film was formed as the amorphous layer.

Figure 4:
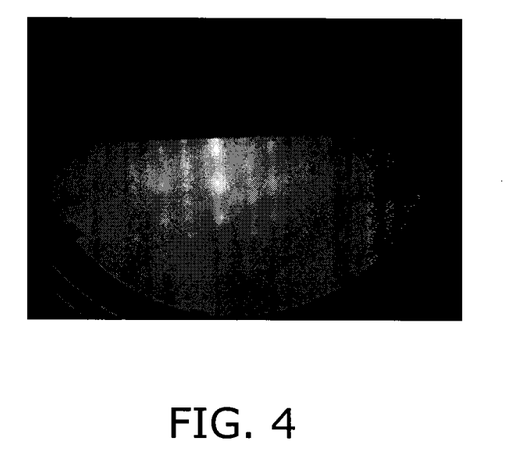
FIG. 4 is an RHEED image showing characteristics of an AlN layer fabricated in the experiment.

FIG. 4 is an RHEED image illustrating characteristics of an AlN layer fabricated in the experiment.

This figure shows the RHEED image of a sample, wherein a TaAl film is formed as an amorphous layer and the AlN layer is formed thereon.

As shown in FIG. 4, in the RHEED image, spot (dot) bright points can be observed. This indicates that the plane directions of the AlN layer are aligned.

Figure 5:
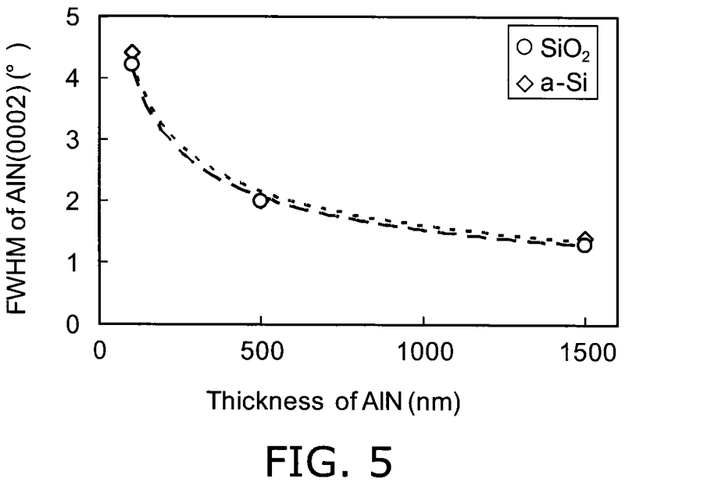
FIG. 5 is a graph showing characteristics of the AlN layer fabricated in the experiment.

FIG. 5 is a graph illustrating characteristics of the AlN layer fabricated in the experiment.

This graph shows the measurement results of an XRD full width at half maximum of a sample, wherein a $SiO_2$ film or a-Si film is formed as the amorphous layer and an AlN layer is formed thereon. The horizontal axis represents the thickness of the AlN layer, while the vertical axis represents the XRD full width at half maximum.

As shown in FIG. 5, in either case of the $SiO_2$ film or a-Si film, a high orientation can be obtained in the AlN layer.

As described above, it was found that by forming an AlN layer (foundation layer 60) on the amorphous layer 50, it is possible to from an AlN layer (foundation layer 60) exhibiting a high orientation even on the substrate 40 (Si substrate, in this example) having a crystallinity different from the AlN layer. The crystal quality of the functional layer 10s can be improved by growing the functional layer 10s on such a foundation layer 60.

In the embodiment, the foundation layer 60 preferably has a residual strain adequate to the crystal growth of the functional layer 10s. For example, the foundation layer 60 can apply a compression stress to the functional layer 10s. Alternatively, the foundation layer 60 can apply a tensile stress to the functional layer 10s. Therefore, in the functional layer 10s, excellent characteristics (e.g., the controllability of injection of charges, the suppression of a crack, a reduction in dislocation density, and the like) can be obtained.

Figure 6:
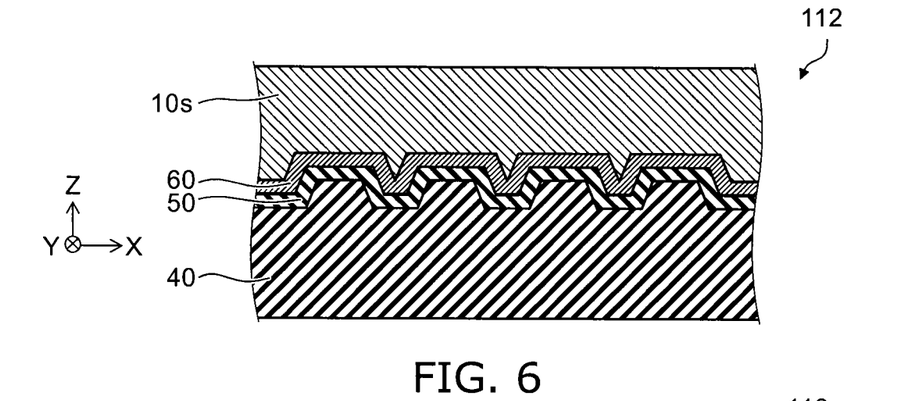
FIG. 6 is a schematic cross-sectional view showing another nitride semiconductor device according to the first embodiment.

FIG. 6 is a schematic cross-sectional view illustrating the configuration of another nitride semiconductor device according to the first embodiment.

As shown in FIG. 6, in another nitride semiconductor device 112 according to the embodiment, the amorphous layer 50 has recesses and projections. For example, the recesses and projections are formed in the amorphous layer 50 by forming recesses and projections on the major surface of the substrate 40. Also in such a nitride semiconductor device 112, the foundation layer 60 having an excellent and uniform crystallinity in the plane can be obtained by forming the foundation layer 60 of AlN on the amorphous layer 50. Therefore, the functional layer 10s having an excellent characteristic can be obtained.

Furthermore, an inclined face may be provided in the recesses and projections of the amorphous layer 50. For example, an inclined face is formed in the recesses and projections of the amorphous layer 50 by providing an inclined face in the recesses and projections formed in the substrate 40.

Figure 7:
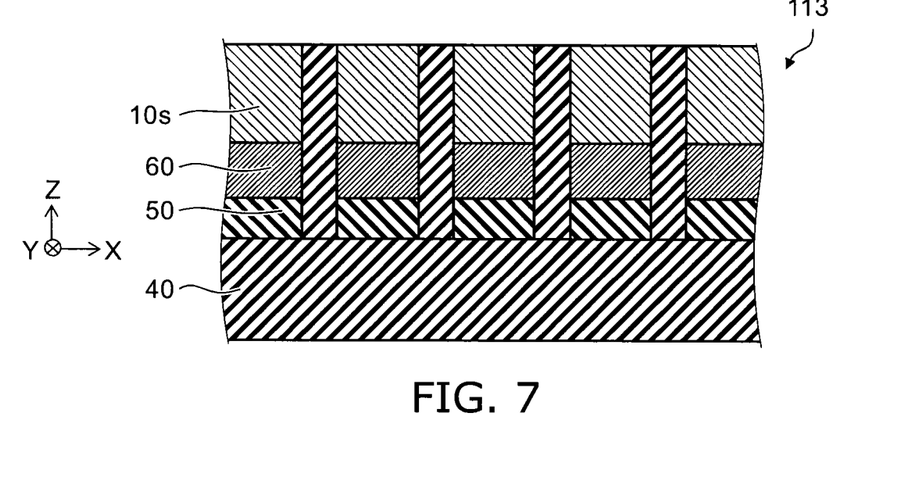
FIG. 7 is a schematic cross-sectional view showing another nitride semiconductor device according to the first embodiment.

FIG. 7 is a schematic cross-sectional view illustrating the configuration of another nitride semiconductor device according to the first embodiment.

As shown in FIG. 7, in another nitride semiconductor device 113 according to the embodiment, the amorphous layer 50 provided on the substrate 40 is patterned and partially provided. Moreover, in this example, the foundation layer 60 is partially provided. Furthermore, the functional layer 10s is partially provided. In this manner, at least one of the amorphous layer 50, the foundation layer 60, and the functional layer 10s can be provided in a plurality of regions in the X-Y plane. Between a region with these layers and a region without them, the crystallinity of a layer formed on the respective regions is varied, and thus selective concentration of defects can be achieved. Therefore, an excellent crystal having a small number of defects in a necessary region can be obtained.

Figure 8:
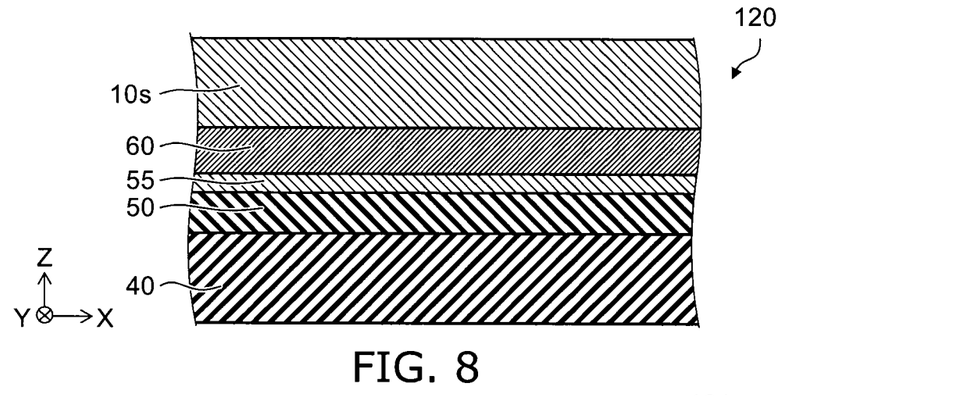
FIG. 8 is a schematic cross-sectional view showing another nitride semiconductor device according to the first embodiment.

FIG. 8 is a schematic cross-sectional view illustrating the configuration of another nitride semiconductor device according to the first embodiment.

Figure 9:
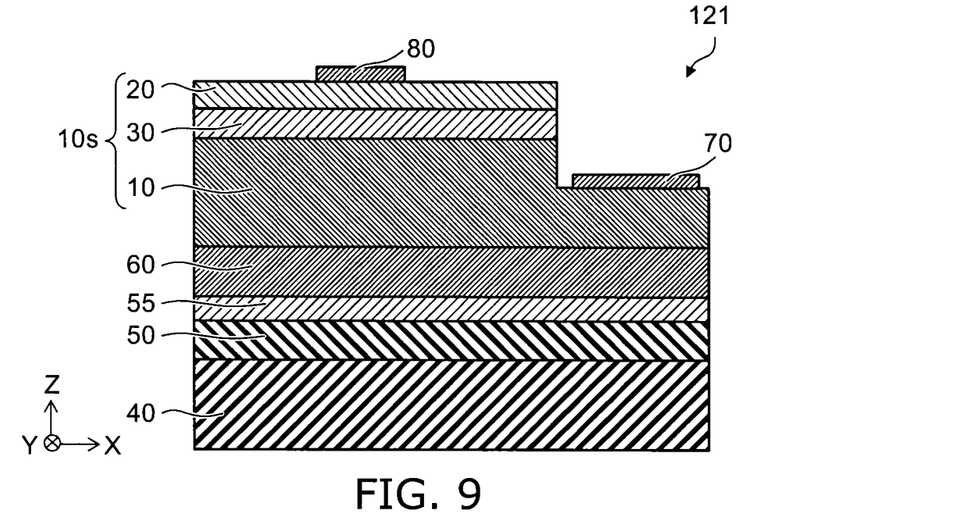
FIG. 9 is a schematic cross-sectional view showing yet another nitride semiconductor device according to the first embodiment.

FIG. 9 is a schematic cross-sectional view illustrating the configuration of yet another nitride semiconductor device according to the first embodiment.

As shown in FIG. 8 and FIG. 9, in another nitride semiconductor device 120 and another nitride semiconductor device 121 according to the embodiment, the foundation layer 60 is provided on an orientation layer 55 provided on the amorphous layer 50. Other than this is the same as in the case of the nitride semiconductor devices 110 and 111, and thus the description thereof is omitted. Hereinafter, the orientation layer 55 is described. For the orientation layer 55, Al is used, for example.

The inventors formed a TaAl film as the amorphous layer 50 on a Si (100) substrate, and formed, on the TaAl film, an Al film to serve as the orientation layer 55.

Figure 10:
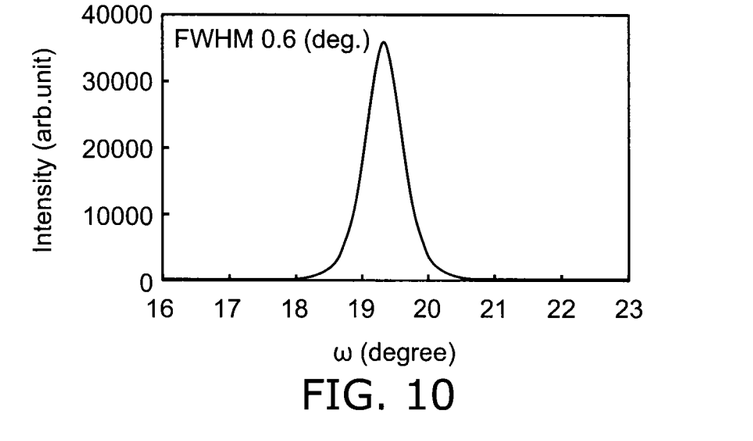
FIG. 10 is graph showing an XRD analysis result showing the characteristics of an Al film fabricated in the experiment.

FIG. 10 is graph showing an XRD analysis result illustrating the characteristics of an Al film fabricated in the experiment.

The horizontal axis of FIG. 10 represents an angle ω while the vertical axis represents the intensity of XRD.

As shown in FIG. 10, it was found that the orientation layer 55 (Al film) formed on the amorphous layer 50 (TaAl film) exhibits high orientation. In this example, the XRD full width at half maximum of the orientation layer 55 (Al film) is 0.6 degrees. In this manner, the foundation layer 60 of high orientation can be obtained by forming the foundation layer 60

(AlN layer) on the orientation layer 55 of high orientation. Then, the functional layer 10s of high orientation can be obtained.

In the embodiment, for the orientation layer 55, at least one of Al, Cu, Au, Ag, Ir, Ni, Pt, Mo, and W is used, for example.

The orientation layer 55 preferably has one of a face-centered cubic lattice structure and a body-centered cubic lattice structure. The XRD full width at half maximum of the orientation layer 55 is preferably not more than 10 degrees.

In this manner, in the nitride semiconductor devices 120 and 121 according to the embodiment, the orientation layer 55 is formed on the amorphous layer 50 and the foundation layer 60 (AlN layer) is provided on the orientation layer 55. Introduction of the orientation layer 55 can further improve the orientation of the foundation layer 60. Moreover, the introduction of the orientation layer 55 enables to achieve a reduction in thickness of the foundation layer 60. Therefore, a nitride semiconductor layer of high crystal quality can be formed even on the substrate 40 having a different crystallinity. Therefore, a nitride semiconductor device which can be formed on any substrate and has excellent crystallinity can be obtained.

There is a method of introducing a buffer layer for relaxing lattice mismatch as a method for growing GaN on a substrate other than the sapphire substrate. For example, there is a method for forming a Zr (zirconium) film on a silicon substrate and growing a GaN layer thereon and thereby relaxing the lattice mismatch between the silicon substrate and the GaN layer. However, in this method, the buffer layer is introduced for the purpose of relaxing the lattice mismatch between the substrate and GaN, and therefore there is a limitation for the substrate to be used.

In contrast, in the embodiment, by introducing the amorphous layer 50 for canceling the crystallinity of the substrate, a nitride semiconductor layer having high crystal quality can be formed even on the substrate 40 having a different crystallinity.

Second Embodiment

This embodiment relates to a nitride semiconductor wafer. In this wafer, there is provided at least a part of a semiconductor device or a portion serving as a part of the semiconductor device, for example. This semiconductor device includes a semiconductor light emitting device, a semiconductor light receiving device, an electron device, and the like, for example.

Figure 11A:
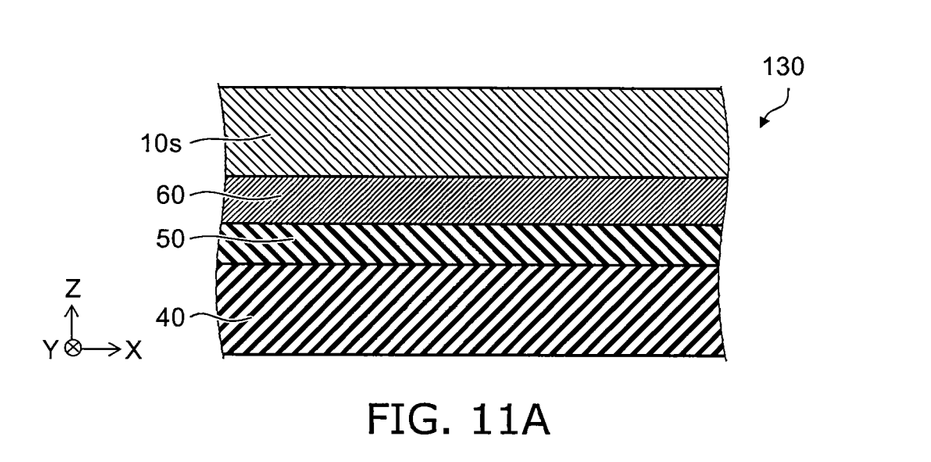
FIGS. 11A and 11B are schematic cross-sectional views each showing a nitride semiconductor wafer according to a second embodiment.
Figure 11B:
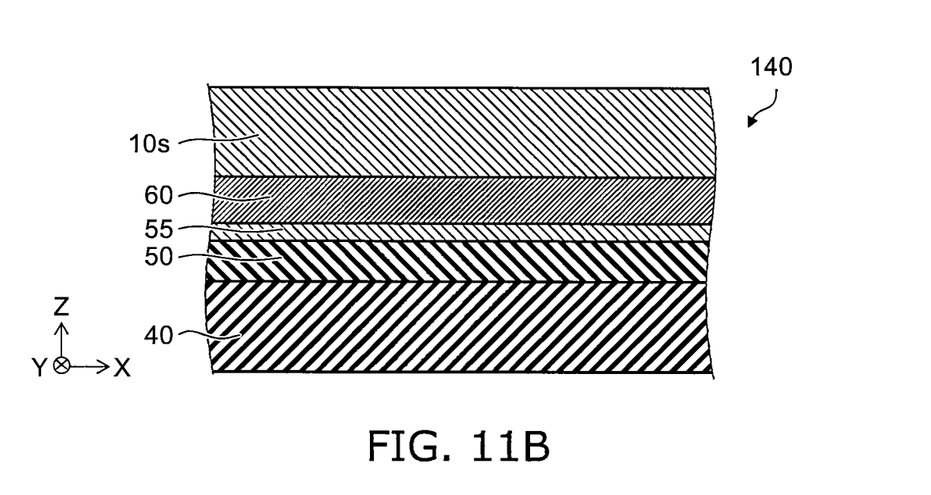

FIGS. 11A and 11B are schematic cross-sectional views each illustrating the configuration of a nitride semiconductor wafer according to a second embodiment.

As shown in FIG. 11A, a nitride semiconductor wafer 130 according to the embodiment includes: the substrate 40; the amorphous layer 50 provided on the substrate 40; the foundation layer 60 provided on the amorphous layer 50, the foundation layer 60 including aluminum nitride; and the functional layer 10s formed on the foundation layer 60, the functional layer 10s including a nitride semiconductor.

To the substrate 40, amorphous layer 50, foundation layer 60, and functional layer 10s, the configuration described with regard to the first embodiment can be applied.

For example, the amorphous layer 50 is a layer of one of silicon oxide and amorphous silicon. Moreover, the amorphous layer 50 may be a layer of an amorphous metal. The foundation layer 60 is preferably oriented in a direction perpendicular to the layer face of the foundation layer 60.

As with the nitride semiconductor device 110 illustrated in FIG. 1, the functional layer 10s can include the first semiconductor layer 10, the light emitting part 30, and the second semiconductor layer 20. The first semiconductor layer 10 is formed on the foundation layer 60, includes a nitride semiconductor, and is of a first conductivity type. The light emitting part 30 is provided on the first semiconductor layer 10, and includes a plurality of barrier layers 31 and a well layer 32 provided between the barrier layers 31. The second semiconductor layer 20 is provided on the light emitting part 30, includes a nitride semiconductor, and is of a second conductivity type different from the first conductivity type.

As shown in FIG. 11B, another nitride semiconductor wafer 140 according to the embodiment further includes the orientation layer 55 provided between the amorphous layer 50 and the foundation layer 60. To the orientation layer 55, the configuration described with regard to the first embodiment can be applied.

For example, the orientation layer 55 preferably has one of a face-centered cubic lattice structure and a body-centered cubic lattice structure. The substrate 40 is preferably a silicon substrate.

Third Embodiment

Figure 12A:
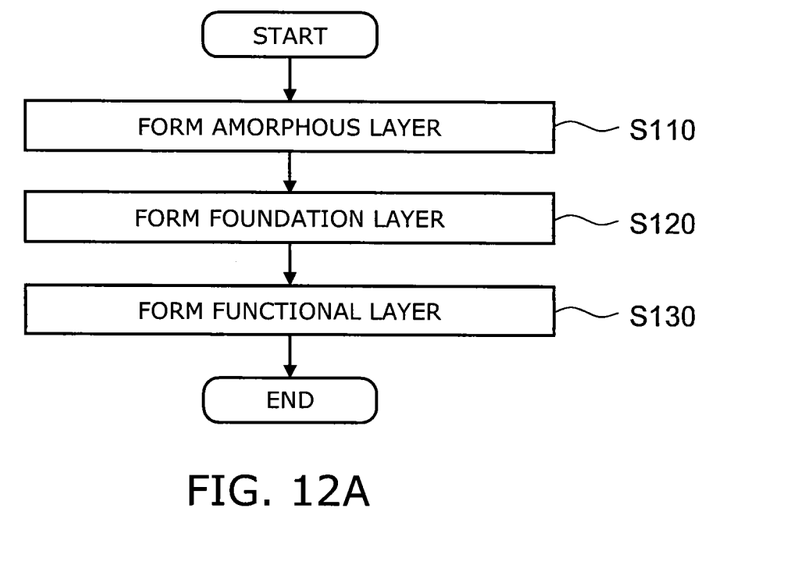
FIGS. 12A and 12B are flowcharts each showing a method for manufacturing a nitride semiconductor layer according to a third embodiment.
Figure 12B:
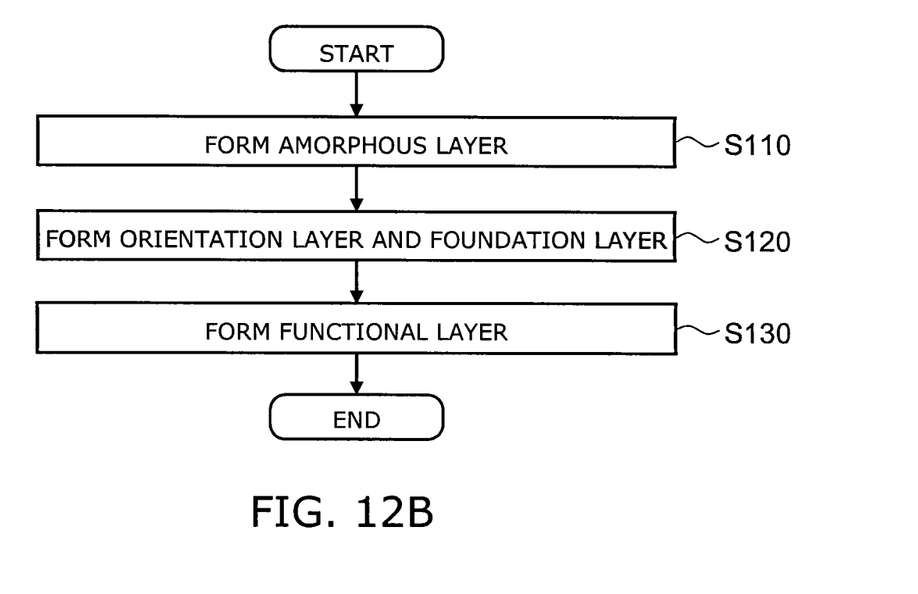

FIGS. 12A and 12B are flowcharts each illustrating a method for manufacturing nitride semiconductor layers according to a third embodiment.

As shown in FIG. 12A, in this manufacturing method, the amorphous layer 50 is formed on the substrate 40 (Step S110). Then, the foundation layer 60 including aluminum nitride is formed on the amorphous layer 50 (Step S120). Then, the functional layer 10s including a nitride semiconductor is formed on the foundation layer 60 (Step S130).

As shown in FIG. 12B, in this manufacturing method, forming the foundation layer 60 (Step S120) includes forming the orientation layer 55 on the amorphous layer 50 and forming the foundation layer 60 on the orientation layer 55.

The orientation layer 55 may have one of a face-centered cubic lattice structure and a body-centered cubic lattice structure, for example.

A sputtering method is used in the forming at least one of the amorphous layer 50 and the foundation layer 60, for example. Use of the sputtering method allows the control of the orientation of a film. Furthermore, a residual strain can be controlled in a wide range. This provides an advantage in improving the crystallinity of the functional layer 10s.

In the forming at least one of the amorphous layer 50 and the foundation layer 60, CVD may be used, for example. When CVD is used, these layers and the functional layer 10s can be continuously formed.

When a Si substrate is used as the substrate 40 and a $SiO_2$ layer is used as the amorphous layer 50, the amorphous layer 50 may be formed by thermal oxidation.

In this manufacturing method, the amorphous layer 50 includes one of silicon oxide and amorphous silicon, for example. Moreover, the amorphous layer 50 may be a layer of an amorphous metal. Moreover, the foundation layer 60 is orientated in the direction perpendicular to the layer face of the foundation layer 60, for example.

In the formation of the functional layer 10s, for example, the first semiconductor layer 10 is formed on the foundation layer 60, the light emitting part 30 is formed thereon, and the second semiconductor layer 20 is formed thereon. Then, the first electrode 70 and the second electrode 80 are formed, and thus the nitride semiconductor device according to the embodiment is fabricated. The substrate 40 may be removed in any technically feasible process.

In the method for manufacturing the nitride semiconductor device, nitride semiconductor wafer, and nitride semiconductor layer according to the embodiment, for example, metal-organic chemical vapor deposition (MOCVD), metal-organic vapor phase epitaxy, or the like can be used as the method for growing semiconductor layers.

In the manufacturing method according to the embodiment, a nitride semiconductor layer having excellent crystallinity can be manufactured on any substrate.

In the manufacturing method, the foundation layer 60 (first layer) is particularly favorable to be formed by the sputtering method. For example, when the AlN layer serving as the foundation layer 60 is formed by the CVD method or MOCVD method, it is difficult to control a stress applied to the foundation layer 60. In contrast, it is possible to add controllably a compressive strain (compressive stress) or a tensile strain (tensile stress) to the foundation layer 60 by forming the foundation layer 60 by the sputtering method.

Hereinafter, the example of characteristics in the case of forming the AlN layer of the foundation layer 60 by the sputtering method is described.

Figure 13:
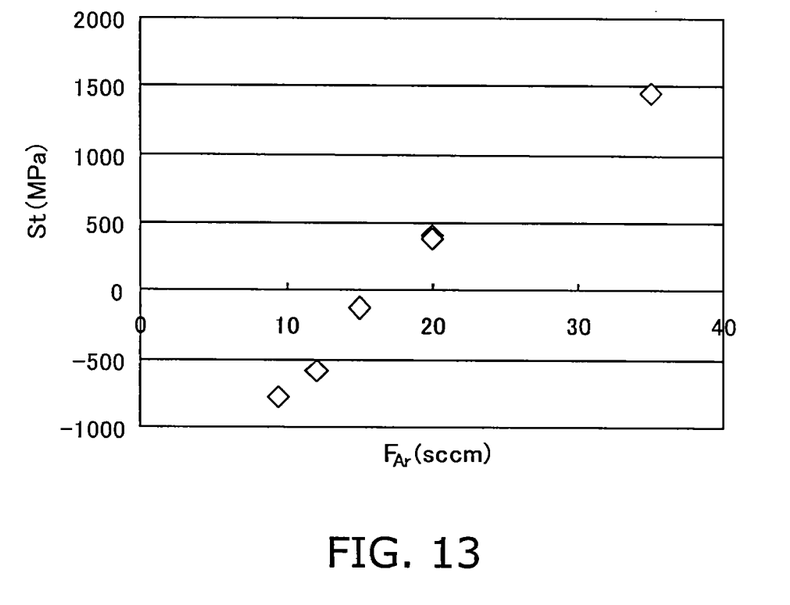
FIG. 13 is a graph showing characteristics in a method for manufacturing a nitride semiconductor layer according to a third embodiment.

FIG. 13 is a graph illustrating the characteristics of the method for manufacturing the nitride semiconductor layer according to the third embodiment.

FIG. 13 shows the measurement results of stress of the AlN layer when using an $SiO_2$ film as the amorphous layer 50 and forming AlN thereon by the sputtering method. In the sputtering, an Al target is used, a high frequency power Pw is set to 150 W (watt), a $N_2$ gas flow rate is set to 10 sccm (Standard Cubic Centimeter per Minutes), and an Ar gas flow rate is changed. The horizontal axis of FIG. 13 represents an Ar gas flow rate $F_{Ar}$ (sccm), and the vertical axis represents a stress St (residual stress) (MPa: Mega Pascal) of the AlN layer. If the stress St is positive, the tensile stress is applied, and if the stress St is negative, the compressive stress is applied. When the stress St is positive, the tensile strain is formed in the AlN layer, and when the stress St is negative, the compressive strain is formed in the AlN layer.

As shown in FIG. 13, if the Ar gas flow rate $F_{Ar}$ is small, the compressive stress (compressive strain) is obtained and if the Ar gas flow rate $F_{Ar}$ is large, the tensile stress (tensile strain) is obtained. The stress St varies substantially linearly in accordance with change of the Ar gas flow rate $F_{Ar}$. In this way, it is possible to apply the stress St in a broad range from the compressive stress to the tensile stress to the AlN layer controllably by changing the Ar gas flow rate $F_{Ar}$. For example, Ar is trapped in the AlN layer during film formation, the degree varies by changing the Ar gas flow rate $F_{Ar}$, and as a result, the stress in the AlN layer is considered to varies.

In the example shown in FIG. 13, the stress St is controlled within a range of −1000 MPa to +1500 MPa, however the embodiment is not limited thereto. In the embodiment, the stress St can be controlled within a wide range from compression to tensile, −4000 MPa to +3000 MPa. The control of the stress St in the wide range like this is the effect achieved particularly by forming a film using sputtering. The stress St of −1000 MPa corresponds to, for example, the compressive strain of about 0.3%. The stress St of +1500 MPa corresponds to, for example, the tensile strain of about 0.5%. The stress St of −4000 MPa corresponds to, for example, the compressive strain of about 1.3%. The stress St of +3000 MPa corresponds to, for example, the tensile strain of about 1.0%.

Figure 14:
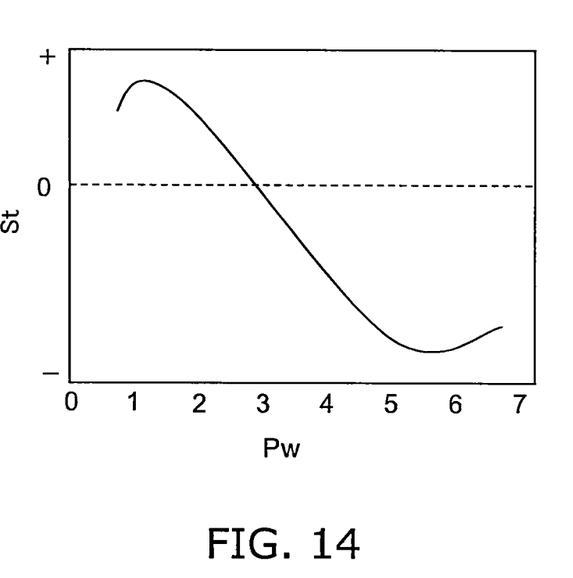
FIG. 14 is a graph showing characteristics in the method for manufacturing the nitride semiconductor layer according to the third embodiment.

FIG. 14 is a graph illustrating the characteristics of the method for manufacturing the nitride semiconductor device according to the third embodiment.

FIG. 14 the stress St of the AlN layer when using an $SiO_2$ film as the amorphous layer 50 and forming AlN thereon by the sputtering method. The horizontal axis of FIG. 14 represents high frequency power Pw (arbitrary scale), and the vertical axis represents the stress St (arbitrary scale).

As shown in FIG. 14, if the high frequency power Pw is small, the compressive stress (compressive strain) is obtained and if the high frequency power Pw is large, the tensile stress (tensile strain) is obtained. The stress St varies substantially linearly in accordance with change of the high frequency power Pw in the prescribed range. In this way, it is possible to apply the stress St in a broad range from the compressive stress to the tensile stress to the AlN layer controllably by changing the high frequency power Pw. For example, increasing the high frequency power Pw causes the AlN layer to be dense, and it is considered that the compressive stress is generated by the increase of temperature.

The stress in the AlN layer can also be controlled by changing the temperature during the film formation in the sputtering.

In this way, when forming the AlN layer using the sputtering, the stress in the AlN layer can be generated precisely and reproducibly by controlling easily adjustable parameters such as an Ar gas flow rate $F_{Ar}$, a high frequency power Pw and temperature or the like.

According to sputtering, for example, the AlN layer with a largely varied density can be formed compared with other methods. In the AlN layer formed by the sputtering, it is easy to generate a stress in a wide range from the compression to tensile.

For example, when using a silicon substrate as the substrate 40, the residual stress (stress St) added to the AlN layer is favorable to be in a range from −4000 Mpa to −1000 Mpa. In the embodiment, the AlN layer is favorable to have, for example, the compressive strain from 1.3% to 0.3%. It is effectively control a warpage of the substrate after crystal growth by using this condition. The relationship between the stress St and the strain may change depending on a type of the substrate on which the AlN layer is formed and the AlN film or the like. The value of the stress St and the value of the strain described above are examples of adequate values in a practical semiconductor light emitting device.

However, the range of the adequate residual stress is different depending on the type and the thickness of the substrate used in the crystal growth and the temperature during the film formation. In the embodiment, the residual stress (stress St) added to the AlN layer is arbitrary.

Fourth Embodiment

A nitride semiconductor device according to the embodiment has the same configuration as the nitride semiconductor devices according to the first and second embodiments. However, in the embodiment, the foundation layer 60 (AlN) has the compressive or tensile stress. That is, the foundation layer 60 has the residual stress of the compressive stress or tensile stress. The residual stress (strain) is designed to fit the crystal growth of the functional layer 10s. For example, the case where the silicon substrate is used for the substrate 40, the $SiO_2$ film is used for the amorphous layer 50, and the functional layer 10s includes the GaN layer is illustratively described.

FIGS. 15A to 15D are schematic cross-sectional views illustrating the characteristics of nitride semiconductor devices.

Figure 15A:
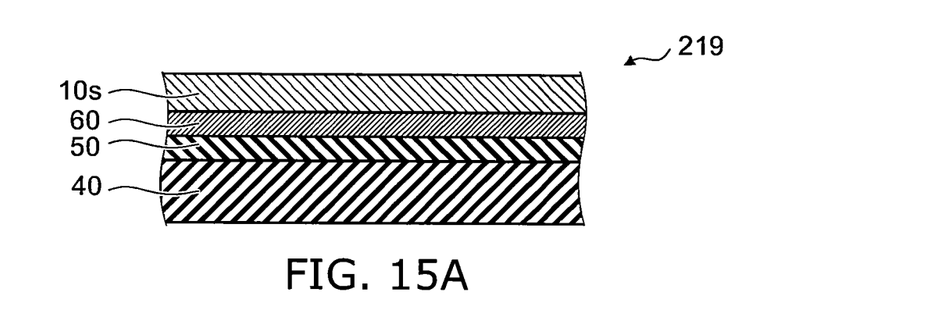
FIG. 15A to FIG. 15D are schematic cross-sectional views showing characteristics of nitride semiconductor devices.
Figure 15B:
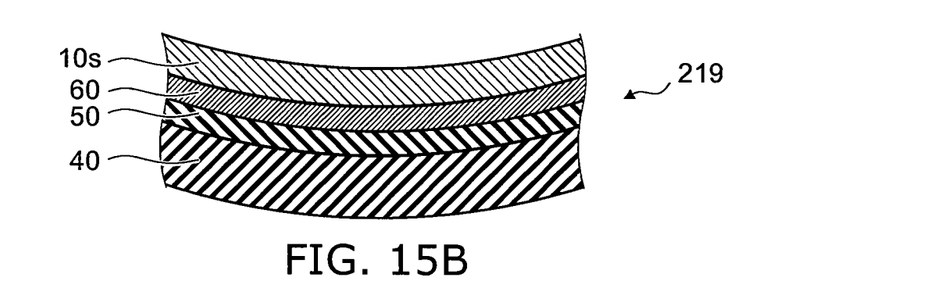
Figure 15C:
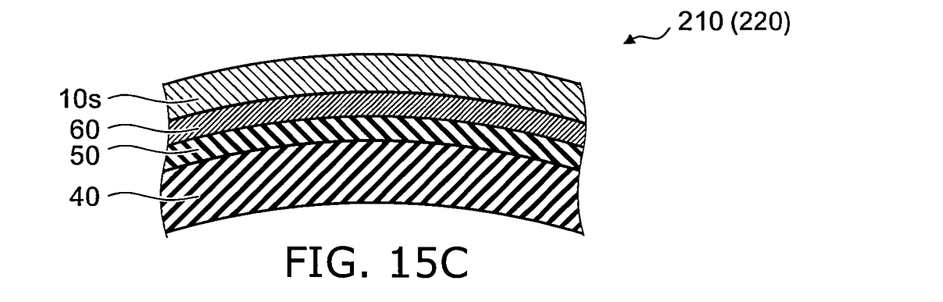
Figure 15D:
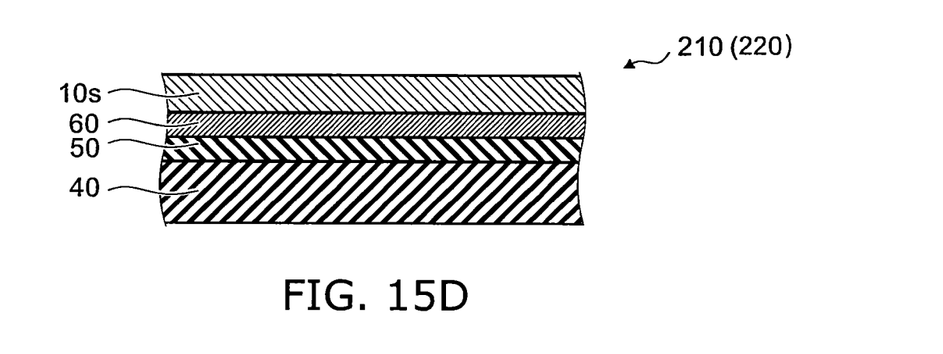

FIG. 15A and FIG. 15B correspond to a nitride semiconductor device 219 including the foundation layer 60 with no residual stress (strain), and FIG. 15C and FIG. 15D correspond to a nitride semiconductor device 210 including the foundation layer 60 with a compressive stress (compressive strain). FIG. 15A and FIG. 15C illustrate a state in which crystal growth of the functional layer 10s is progressing. The temperature during the crystal growth of the functional layer 10s is high to be, for example, not less than 900° C. and not more than 1200° C. FIG. 15B and FIG. 15D illustrate a state in which the crystal growth of the functional layer 10s is finished and the temperature decreased to a room temperature.

As shown in FIG. 15A, in the nitride semiconductor device 219 including the foundation layer 60 with no stress, the whole substrate is flat at a high temperature during the crystal growth of the functional layer 10s. As shown in FIG. 15B, the substrate is concave upward when returned to the room temperature. This is due to a difference of a thermal expansion coefficient between silicon and GaN. In this way, when the foundation layer 60 has no stress, a large warpage is generated, furthermore a crack is easy to occur. In this state, a large tensile stress is applied to the functional layer 10s. This state, for example, may deteriorate the characteristics of an active layer included in the functional layer 10s. Specifically, a defect density such as a dislocation density increases and an injection efficiency of a charge is decreased. A leak point may increase.

In contrast, as shown in FIG. 15C, in the nitride semiconductor device 210 including the foundation layer with the compressive stress, the whole substrate is convex upward during the crystal growth of the functional layer 10s. As shown in FIG. 15D, the whole substrate becomes flat when returned to the room temperature. That is, the substrate warpage is more suppressed than the state illustrated in FIG. 15B. In this way, when the foundation layer 10s has the compressive stress, the warpage is suppressed and the crack occurrence is also suppressed. An adequate control of the stress of the foundation layer 60 allows an adequate stress to be applied to the functional layer 10s as well. For example, forming the state of an adequate compressive stress being applied to the functional layer 10s allows the effect of a piezo electric field to be reduced. Furthermore, a process of sticking together in a device fabrication process becomes easy. For example, forming the state of an adequate tensile stress being applied to the functional layer 10s can influence the mobility of a charge (at least one of a hole and an electron).

In this way, the nitride semiconductor device 210 according to the embodiment includes: the first layer (foundation layer 60) formed on the amorphous layer 50, including aluminum, and having the compressive strain or tensile strain; and the functional layer 10s formed on the first layer and including the nitride semiconductor. Thereby, the occurrence of the warpage and crack can be suppressed. As a result, a nitride semiconductor device capable of being formed on an arbitrary substrate and having good crystallinity can be provided.

FIG. 15C and FIG. 15D illustrate the characteristics of the nitride semiconductor device 220 including the foundation layer 60 with the compressive strain as well. Also in the nitride semiconductor device 220, the warpage and crack of the wafer can be suppressed.

That is, the nitride semiconductor device 220 according to the embodiment includes: the substrate 40; the amouphous layer 50 provided on the substrate 40; the first layer (foundation layer 60) provided on the amorphous layer 50, including aluminum, and having the compressive strain or tensile strain; and the functional layer 10s formed on the first layer and including the nitride semiconductor. Thereby, thereby, the warpage and crack can be suppressed. As a result, a nitride semiconductor wafer capable of being formed on an arbitrary substrate and having good crystallinity can be provided.

It is conceived that the AlN layer is formed on SiN by a method of supplying a source material including Al to grow AlN, such as combining deposition of Al by FIB (Focused Ion Beam) with a thermal treatment or combining metal deposition with a thermal treatment. In this method, the AlN layer is formed using migration by the thermal treatment, and thus high temperature thermal treatment is necessary and problems of damage to the substrate and throughput are caused. When AlN is formed on SiN, the AlN layer is formed through taking N included in SiN into the Al film, and thus a thickness of the formed AlN film is restricted. SiN in the base is decomposed during forming the AlN layer, and thus the AlN layer is influenced by the decomposed SiN. Therefore, it is difficult to obtain AlN crystal with good crystallinity in this method. When AlN is formed on the amorphous $SiO_2$ film, the above restriction and influence from the base do not occur.

On the other hand, in the embodiment, the AlN layer is formed by sputtering, and thus a high temperature thermal treatment is unnecessary. Therefore, damage to the substrate is suppressed and a high throughput is achieved. AlN is easy to be grown also on a large area wafer. In the embodiment, in the AlN layer formed by using an easy manufacturing method, the stress (strain) of the AlN layer is adequately controlled and a nitride semiconductor device with good crystallinity can be formed also on an arbitrary substrate.

The stress in the foundation layer 60 is determined from, for example, X-ray diffraction.

Figure 16:
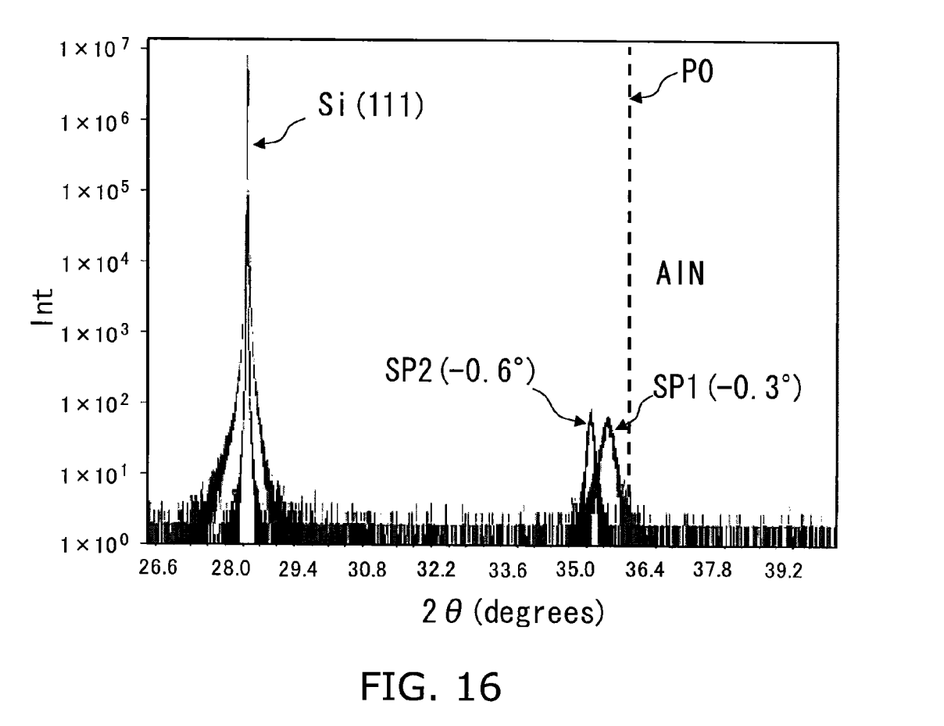
FIG. 16 is a graph showing characteristics of a nitride semiconductor device according to a fourth embodiment.

FIG. 16 is a graph illustrating the characteristics of the nitride semiconductor device according to the fourth embodiment. FIG. 16 shows X-ray diffraction analysis results of a specimen that a silicon (111) substrate is used as the substrate 40, and the AlN layer serving as the foundation layer 60 is formed on the amorphous layer 50 by sputtering. FIG. 16 shows the results of two specimens (first specimen SP1 and second specimen SP2) having different sputtering conditions. The horizontal axis of FIG. 16 represents a rotation angle 2θ (degree) in the X-ray diffraction analysis, and the vertical axis represents an intensity Int (arbitrary scale). In FIG. 16, a peak at the rotation angle 2θ of about 28.5 degree corresponds to a peak of Si(111) of the substrate 40.

These specimens are formed under conditions of an $N_2$ gas flow rate of 5.5 sccm, a microwave power of 500 W, a high frequency power of 500 W, a film formation temperature of 200° C. The Ar gas flow rate is 30 sccm for the first specimen SP1, and the Ar gas flow rate is 20 sccm for the second specimen. A film formation apparatus used in this experiment is different from a film formation apparatus used in the experiment described with regard to FIG. 13.

As shown in FIG. 16, In the AlN layer P0 without applied stress, a peak appears at a rotation angle θ of about 36.0 degree. When the angle 2θ corresponding to the X-ray diffraction peak is larger than 2θ of 36.0 degree at no stress in the specimen of the AlN layer, the tensile stress is applied to the specimen (namely, the specimen has the tensile strain), and when smaller than 36.0 degree, the compressive stress is applied to the specimen (namely the specimen has the compressive strain).

As shown in FIG. 16, in the first specimen SP1, a peak appears at 2θ of about 35.7 degree (−0.3 degree with respect to no stress). In the second specimen SP2, a peak appears at 2θ of about 35.4 degree (−0.6 degree with respect to no stress).

In these specimens, in X-ray diffraction, the rotation angle 2θ corresponding to the peak of the AlN layer is smaller than the rotation angle 2θ corresponding to the peak of the AlN layer P0 with no stress applied, it is determined that the compressive stress is applied (namely, having the compressive strain). The magnitude of the compressive stress (compressive strain) corresponds to a difference from 2θ of 36.0 degree at no stress.

For example, in the embodiment, the absolute value of the difference between the rotation angle 2θ corresponding to the peak in the X-ray diffraction of the AlN layer of the foundation layer 60 and the rotation angle 2θ corresponding to the peak of the AlN layer P0 with no stress applied is not less than 0.3 degree.

However, the embodiment is not limited thereto. The compressive stress of the foundation layer 60 can be adjusted in accordance with desired characteristics.

In this way, the residual stress can be measured by, for example, the X-ray diffraction method. The strain in the AlN layer (difference from the AlN layer P0 with no stress applied) is determined by analyzing the AlN layer by the X-ray diffraction method. The calculation for AlN layer can be carried out by a value of the determined strain.

When the foundation layer 60 has the compressive stress, the foundation layer 60 applies the tensile stress to the functional layer 10s formed on the foundation layer 60. When the foundation layer 60 has the tensile stress, the foundation layer 60 applies the compressive stress to the functional layer 10s formed on the foundation layer 60.

When a combination of a material used for the substrate 40 with a material used for the functional layer 10s is different from the above, the stress (compressive stress or tensile stress) in the foundation layer 60 may be adjusted in accordance with the combination.

In this way, adjusting the stress in the foundation layer 60 allows the warpage and crack to be suppressed and can realize high crystallinity of the functional layer 10s formed on the foundation layer 60.

As illustrated in FIG. 8, the nitride semiconductor device 211 further includes the orientation layer 55 (second layer) in the configuration of the nitride semiconductor device 210.

As illustrated in FIG. 11B, the nitride semiconductor wafer 211 further includes the orientation layer 55 in the configuration of the nitride semiconductor wafer 220.

The orientation layer 55 is, for example, crystalline. Here, a state in which the orientation layer is crystalline also includes a state in which the orientation layer includes fine crystal other than a state of single crysta. The state of being crystalline is the state of being not amorphous. The state of being crystalline is referred to as a state of having orientation along any direction. For example, the orientation layer 55 has a crystal structure. The orientation layer 55 has, for example, one of a face-centered cubic lattice structure and a body-centered cubic lattice structure.

The orientation layer 55 may be formed by the sputtering. Thereby, formation of the orientation layer 55 and formation of the foundation layer 60 can be made within the same apparatus, and the apparatus efficiency is improved. Furthermore, the stress of compression or tensile may be added to the orientation layer 55. The warpage and crack can be more effectively suppressed from occurring.

According to the embodiment, a nitride semiconductor device which can be formed on any substrate and has excellent crystallinity, a nitride semiconductor wafer, and a method for manufacturing nitride semiconductor layers can be provided.

In the specification, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which each of the compositional proportions x, y, and z are changed within the ranges. "Nitride semiconductor" further includes group V elements other than N (nitrogen) in the chemical formula recited above, various elements added to control various properties such as the conductivity type, etc., and various elements included unintentionally.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the invention is not limited to these specific examples. For example, one skilled in the art may similarly practice the invention by appropriately selecting specific structures of components, such as a substrate, an amorphous layer, a foundation layer, an orientation layer, a semiconductor layer, a light emitting part, and an electrode, included in a nitride semiconductor device and wafer, from known art.

Further, any two or more components of the specific examples may be combined within the extent of technical feasibility and are included in the scope of the embodiments to the extent that the spirit of the embodiments is included.

Moreover, all the nitride semiconductor devices, nitride semiconductor wafers, and methods for manufacturing nitride semiconductor layers practicable by an appropriate design modification by one skilled in the art based on the nitride semiconductor devices, nitride semiconductor wafers, and methods for manufacturing nitride semiconductor layers described above as embodiments of the invention also are within the scope of the invention to the extent that the purport of the embodiments of the invention is included.

Furthermore, various modifications and alterations within the spirit of the invention will be readily apparent to those skilled in the art.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nitride semiconductor device comprising:
    a first layer formed on an amorphous layer, wherein said first layer comprises aluminum nitride and has a compressive strain or an tensile strain; and
    a functional layer formed on the first layer, wherein said functional layer comprises a nitride semiconductor,
    wherein the first layer is provided on a second layer, the second layer being provided on the amorphous layer and having one of a face-centered cubic lattice structure and a body-centered cubic lattice structure.

2. The nitride semiconductor device according to claim 1, wherein the first layer has a compressive strain.

3. The nitride semiconductor device according to claim 1, wherein the functional layer comprises
    a first semiconductor layer of a first conductivity type, the first semiconductor layer being formed on the first layer and comprising a nitride semiconductor,
    a light emitting part provided on the first semiconductor layer, the light emitting part comprising a plurality of barrier layers and a well layer provided between the plurality of barrier layers, and a second semiconductor layer of a second conductivity type different from the first conductivity type, the second semiconductor layer being provided on the light emitting part and comprising a nitride semiconductor.

4. The nitride semiconductor device according to claim 1, wherein the amorphous layer is one of silicon oxide and amorphous silicon.

5. The nitride semiconductor device according to claim 1, wherein the amorphous layer is an amorphous metal.

6. The nitride semiconductor device according to claim 1, wherein the first layer is oriented in a direction perpendicular to a layer face of the first layer.

7. The nitride semiconductor device according to claim 1, wherein the second layer comprises at least one of Al, Cu, Au, Ag, Ir, Ni, Pt, Mo and W.

8. A nitride semiconductor wafer comprising:
a substrate;
an amorphous layer provided on the substrate;
a first layer formed on an amorphous layer, wherein said first layer comprises aluminum nitride and has a compressive strain or an tensile strain;
a functional layer formed on the first layer, wherein said functional layer comprises a nitride semiconductor; and
a second layer provided between the amorphous layer and the first layer, and having one of a face-centered cubic lattice structure and a body-centered cubic lattice structure.

9. The nitride semiconductor wafer according to claim 8, wherein the first layer has a compressive strain.

10. The nitride semiconductor wafer according to claim 8, wherein the amorphous layer is one of silicon oxide and amorphous silicon.

11. The nitride semiconductor wafer according to claim 8, wherein the first layer is oriented in a direction perpendicular to a layer face of the first layer.

12. The nitride semiconductor wafer according to claim 8, wherein the second layer comprises at least one of Al, Cu, Au, Ag, Ir, Ni, Pt, Mo and W.

13. The nitride semiconductor wafer according to claim 8, wherein the substrate is a silicon substrate.

14. A method for manufacturing a nitride semiconductor layer, comprising:
forming an amorphous layer on a substrate;
forming a first layer on the amorphous layer by sputtering, wherein the first layer comprises aluminum nitride and has a compressive strain or a tensile strain; and
forming a functional layer on the first layer, wherein the functional layer comprises a nitride semiconductor,
wherein the forming the first layer comprises
forming a second layer on the amorphous layer, the second layer having one of a face-centered cubic lattice structure and a body-centered cubic lattice structure, and
forming the first layer on the second layer.

15. The method for manufacturing the nitride semiconductor layer according to claim 14, wherein
the first layer has a compressive strain, and
the substrate is a silicon substrate.

* * * * *